United States Patent
Chan et al.

(10) Patent No.: US 9,293,557 B2
(45) Date of Patent: Mar. 22, 2016

(54) LOW TEMPERATURE SPACER FOR ADVANCED SEMICONDUCTOR DEVICES

(71) Applicant: International Business Machines Corporation, Armonk, NY (US)

(72) Inventors: Kevin K. Chan, Staten Island, NY (US); Alfred Grill, White Plains, NY (US); Deborah A. Neumayer, Danbury, CT (US); Dae-Gyu Park, Poughquaq, NY (US); Norma E. Sosa, Ossining, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 14/330,086

(22) Filed: Jul. 14, 2014

(65) Prior Publication Data

US 2015/0236115 A1 Aug. 20, 2015

Related U.S. Application Data

(60) Provisional application No. 61/942,179, filed on Feb. 20, 2014.

(51) Int. Cl.
*H01L 21/8238* (2006.01)
*H01L 29/51* (2006.01)
(Continued)

(52) U.S. Cl.
CPC ...... *H01L 29/518* (2013.01); *H01L 21/823468* (2013.01); *H01L 29/6653* (2013.01)

(58) Field of Classification Search
CPC .............. H01L 29/518; H01L 29/6656; H01L 29/6653; H01L 21/823468
USPC .......... 438/184, 230, 303, 304, 595, 596, 639
See application file for complete search history.

(56) References Cited

U.S. PATENT DOCUMENTS

| | | | |
|---|---|---|---|
| 5,521,422 A | 5/1996 | Mandelman et al. |
| 6,110,828 A | 8/2000 | Guo et al. |

(Continued)

FOREIGN PATENT DOCUMENTS

| | | |
|---|---|---|
| KR | 19970030910 A | 6/1997 |
| KR | 1020080087268 A | 10/2008 |

OTHER PUBLICATIONS

Chan et al., "Low Temperature Spacer for Advanced Semiconductor Devices", U.S. Appl. No. 61/942,179, filed Feb. 20, 2014.

(Continued)

*Primary Examiner* — Kevin M Picardat
(74) *Attorney, Agent, or Firm* — Noah A. Sharkan; Louis J. Percello

(57) ABSTRACT

Embodiments of the present invention provide semiconductor structures and methods for making the same that include a boron nitride (BN) spacer on a gate stack, such as a gate stack of a planar FET or FinFET. The boron nitride spacer is fabricated using atomic layer deposition (ALD) and/or plasma enhanced atomic layer deposition (PEALD) techniques to produce a boron nitride spacer at relatively low temperatures that are conducive to devices made from materials such as silicon (Si), silicon germanium (SiGe), germanium (Ge), and/or III-V compounds. Furthermore, the boron nitride spacer may be fabricated to have various desirable properties, including a hexagonal textured structure.

19 Claims, 10 Drawing Sheets

(51) Int. Cl.
  *H01L 29/66* (2006.01)
  *H01L 21/8234* (2006.01)

(56) References Cited

U.S. PATENT DOCUMENTS

| | | | |
|---|---|---|---|
| 6,992,010 B2 | 1/2006 | Chou et al. | |
| 7,829,943 B2 | 11/2010 | Sell | |
| 8,148,269 B2 | 4/2012 | Balseanu et al. | |
| 8,476,743 B2 | 7/2013 | Nguyen et al. | |
| 8,551,872 B2 | 10/2013 | Chen et al. | |
| 8,551,874 B2 | 10/2013 | Seo et al. | |
| 8,900,957 B2 * | 12/2014 | Chung | H01L 21/823807 438/230 |
| 8,901,616 B2 * | 12/2014 | Frank | H01L 21/8238 257/213 |
| 9,054,178 B2 * | 6/2015 | Bohr | H01L 21/76831 |
| 2009/0263972 A1 | 10/2009 | Balseanu et al. | |
| 2013/0049172 A1 | 2/2013 | Loubet et al. | |
| 2014/0327054 A1 * | 11/2014 | Adam | H01L 29/6656 257/288 |

OTHER PUBLICATIONS

Han et al., "Advanced Al Damascene Process for Fine Trench Under 70nm Design Rule", MRS Proceedings, vol. 863, 2005, Symposium B—Materials, Technology and Reliability of Advanced Interconnects, DOI: http://dx.doi.org/10.1557/PROC-863-B8.23 (About DOI), Copyright © Material Research Society 2005.

* cited by examiner

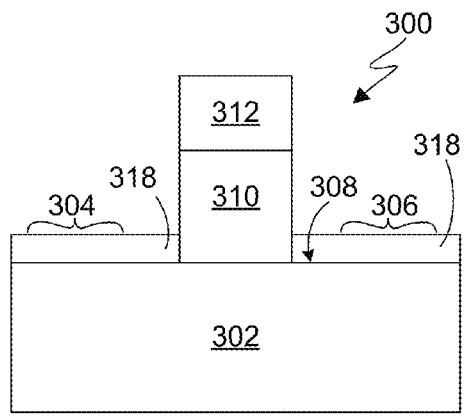
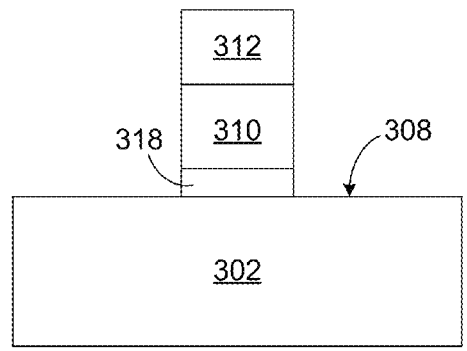
FIG. 3A  FIG. 3B
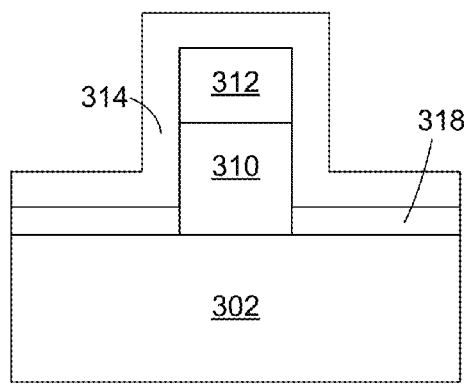
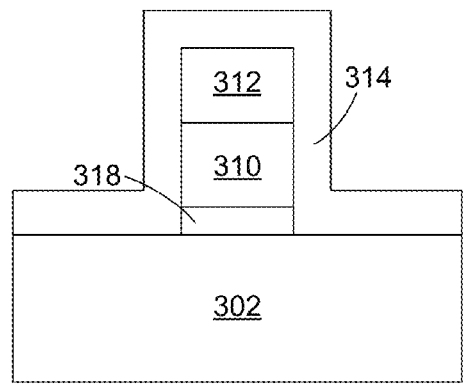
FIG. 3C  FIG. 3D

| Layer | RTCVD Si₃N₄ after RIE | Textured boron nitride after RIE |
|---|---|---|
| Wet etch rate ratio (DHF 100:1) @ RT against thermal oxide | 0.31 | 0.011 |
| Wet etch rate ratio (NH₄OH : H₂O₂ : H₂O) @ 35C against thermal dioxide | 0.4 | 0.6 |
| Dielectric constant measured on MOS capacitor | 5.7 (160 Å) | 3.36 (160 Å) |

FIG. 10

LOW TEMPERATURE SPACER FOR ADVANCED SEMICONDUCTOR DEVICES

CROSS-REFERENCE TO RELATED APPLICATIONS

This application claims the benefit of U.S. Provisional Patent Application No. 61/942,179 having a filing date of Feb. 20, 2014, the entire contents of which are hereby incorporated by reference.

FIELD OF THE INVENTION

The present invention relates generally to the field of semiconductor devices, and more particularly to low temperature boron nitride spacers for use on gate stacks of transistors.

BACKGROUND OF THE INVENTION

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

Field-effect transistors (FETs), such as planar metal-oxide-semiconductor FETs (MOSFETs) and 3-dimensional FinFETs, are semiconductor devices. Generally, a FET has three terminals: a gate structure (or gate stack), a source region, and a drain region. The gate stack comprises a gate electrode formed of conductive material, and a metal-oxide insulating layer disposed between the gate electrode and the body of the transistor. By varying the voltage applied to the gate electrode, the gate stack controls a flow of charge carriers through a channel beneath the gate stack and between the source and the drain regions, thereby turning the transistor on or off. The source region is a doped region in the semiconductor device from which majority charge carriers are flowing into the channel portion. The drain region is a doped region in the semiconductor device, located at the end of the channel portion, to which charge carriers are flowing from the source region via the channel portion.

Gate stacks may include a spacer layer, formed as a sidewall of the gate stack. The spacer layer electrically isolates the gate electrode from the source and drain contacts, protects the gate stack from physical degradation during fabrication, and also protects the gate electrode metal from oxygen and moisture. The spacer layer must generally be resistant to wet etches used in the fabrication processes and has to be fabricated at temperatures compatible with other materials of the semiconductor device. Typically, the spacer layer is formed of silicon nitride ($Si_3N_4$). Silicon nitride has good wet etch selectivity when deposited at high temperatures (e.g., approximately 700 to 850 degrees Celsius) used in pure-silicon fabrication techniques. However, when silicon nitride is deposited at the lower temperatures required for next-generation silicon technology, silicon nitride typically exhibits poor etch selectivity and, therefore, hinders fabrication. For example, etch selectivity of silicon nitride is poor when deposited at temperatures compatible with silicon germanium (SiGe) or germanium (Ge) devices (e.g., approximately 650 degrees Celsius or less), and is even worse when deposited at temperatures compatible with III-V devices (e.g., approximately 600 degrees Celsius or less).

SUMMARY

Embodiments of the present invention provide semiconductor devices and methods for making the same. In one embodiment, a semiconductor device is provided comprising: a semiconductor body; a gate stack disposed atop the semiconductor body; and a boron nitride spacer in direct contact with sidewalls of the gate stack and at least a portion of the semiconductor body, wherein the boron nitride spacer has a thickness greater than or equal to 1 nm and less than or equal to 20 nm and has a hexagonal bonding configuration.

In another embodiment, a semiconductor device is provided comprising: a semiconductor body; a gate stack disposed atop the semiconductor body; a liner layer in direct contact with sidewalls of the gate stack and at least a portion of the semiconductor body; and a boron nitride spacer in direct contact with at least a portion of the liner layer, wherein the boron nitride spacer has a thickness greater than or equal to 1 nm and less than or equal to 20 nm and has a hexagonal bonding configuration.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which:

FIGS. 3A through 3H depict phases of fabrication of a transistor, in accordance with another embodiment of the present invention;

FIG. 10 is a table showing a comparison of wet etch rate ratios and dielectric constants for a silicon nitride layer and a hexagonal textured boron nitride layer, fabricated in accordance with an embodiment of the present invention.

DETAILED DESCRIPTION

Figure 1A:
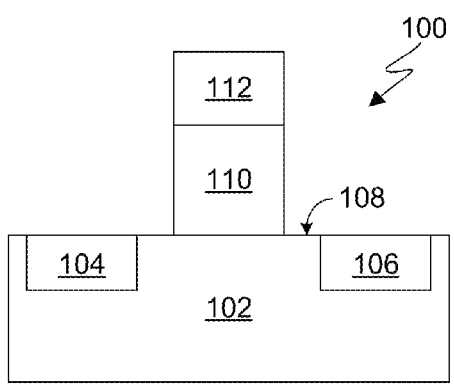
FIGS. 1A through 1D depict phases of fabrication of a transistor, in accordance with an embodiment of the present invention.

Embodiments of the present invention provide semiconductor structures and methods for making the same that include a boron nitride (BN) spacer on a planar FET or Fin-FET. The boron nitride spacer is fabricated using atomic layer deposition (ALD) and/or plasma enhanced atomic layer deposition (PEALD) techniques to produce a conformal boron nitride spacer at relatively low temperatures (e.g., approximately 400 degrees Celsius) that are conducive to devices made from materials such as silicon (Si), silicon germanium (SiGe), germanium (Ge), and/or III-V compounds. Furthermore, the boron nitride spacer may be fabricated to have various desirable properties.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, and some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such a feature, structure, or characteristic in connection with other embodiments whether or not explicitly described.

FIGS. 1A through 1D depict phases of fabrication of FET 100 having boron nitride spacer 114, in accordance with an embodiment of the present invention. FET 100 comprises semiconductor body 102. Preferably, semiconductor body 102 is comprised of silicon, single crystal silicon, polycrystalline silicon, silicon germanium, germanium, polycrystalline silicon germanium, and/or compound semiconductor substrates, such as type III/V semiconductor substrates. Semiconductor body 102 can be comprised of bulk semiconductor substrate, including bulk III-V compounds substrates, and/or semiconductor body 102 can be comprised of a substrate having one or more semiconductor layers thereon. In this exemplary embodiment, semiconductor body 102 is comprised of III-V compounds, having a maximum suitable processing temperature of approximately 600 degrees Celsius or less.

FET 100 comprises three terminals disposed on and/or within semiconductor body 102: source region 104, drain region 106, and gate stack 110. Gate stack 110 is a structure used to control output current (i.e., flow of charge carriers) through a channel between source region 104 and drain region 106. Source region 104, is a doped region from which majority charge carriers flow, and drain region 106 is a doped region located at the end of the channel to which the charge carriers flow. In an alternative embodiment, source region 104 and drain region 106 may be "raised" source/drain regions, wherein a portion of the respective source/drain region is formed through epitaxial growth of semiconductor material embedded in semiconductor body 102. The respective source/drain regions can then rise out of semiconductor body 102, while another portion of the respective source/drain regions resides within semiconductor body 102.

Gate stack 110 is disposed atop upper surface 108 of semiconductor body 102. In this exemplary embodiment, gate stack 110 includes at least a gate conductor atop a gate dielectric. The gate conductor may be a metal gate electrode and may be comprised of any suitable conducting metal, such as tungsten (W), nickel (Ni), titanium (Ti), molybdenum (Mo), tantalum (Ta), copper (Cu), platinum (Pt), silver (Ag), gold (Au), ruthenium (Ru), iridium (Ir), rhodium (Rh), and rhenium (Re), and alloys that include at least one of the aforementioned conductive elemental metals. In another embodiment, the gate conductor may also be composed of a doped semiconductor material, such as n-type doped polysilicon. In yet another embodiment, the gate conductor may be a multi-layered structure having optional diffusion barrier material formed between the conductive materials.

The gate dielectric of gate stack 110 may be any suitable dielectric material, such as silicon dioxide ($SiO_2$) or silicon oxynitride ($SiO_xN_y$), or alternatively a high-k dielectric, such as oxides of hafnium (Hf), tantalum (Ta), lanthanum (La), zirconium (Zr), aluminum (Al), or combinations thereof. The gate conductor and gate dielectric of gate stack 110 may be formed by any suitable deposition and/or growing processes known in the art.

As shown in FIG. 1A, dielectric hardmask 112 is disposed atop gate stack 110. Dielectric hardmask 112 may be comprised of any suitable materials (e.g., a nitride layer) and may be deposited onto gate stack 110 using any suitable techniques known in the art (e.g., chemical vapor deposition).

Figure 1B:
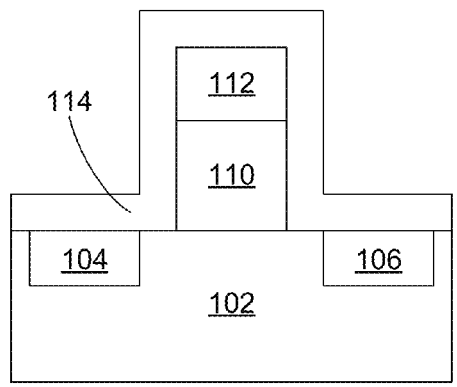
Figure 1C:
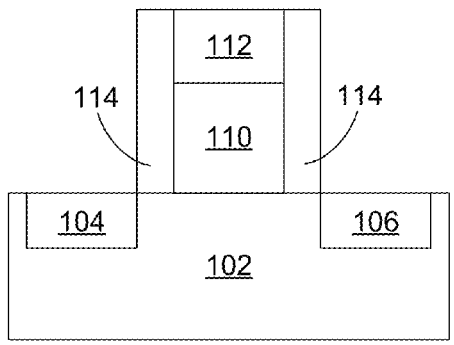
Figure 1D:
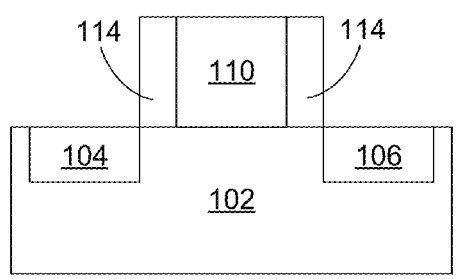

As shown in FIG. 1B, boron nitride is deposited onto FET 100 and, as shown in FIG. 1C, reactive ion etching (RIE) is employed to form boron nitride spacer 114, which is in direct contact with at least the sidewalls of gate stack 110 and hardmask 112, and a portion of upper surface 108 of semiconductor body 102. FIG. 1C shows FET 100 after optionally removing hardmask 112 (e.g., using RIE), such as in the case of dynamic random-access memory (DRAM) devices.

Although only one semiconductor device is shown, any number of semiconductor devices may be formed on semiconductor body 102 in various embodiments. Where multiple devices exist, device regions are preferably separated via dielectric trench isolation (not shown). This prevents electrical current leakage between adjacent semiconductor device components. In various embodiments, isolation regions may be at varying depths to form embodiments of shallow trench isolation or deep trench isolation.

FIGS. 2A through 2D depict phases of fabrication of FET 200, in accordance with an embodiment of the present invention. In this embodiment, FET 200 is similar to FET 100, where like elements have reference numerals increased by a factor of 100 and may not be separately discussed.

Figure 2A:
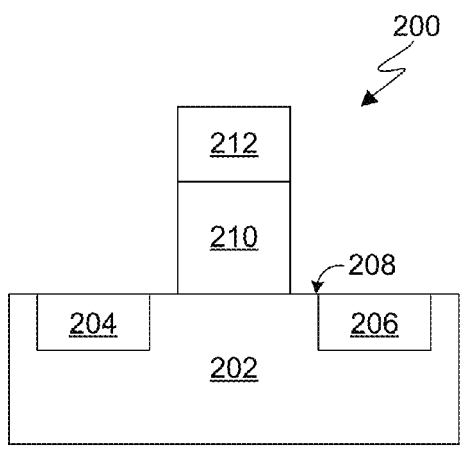
FIGS. 2A through 2D depict phases of fabrication of a transistor, in accordance with another embodiment of the present invention.
Figure 2B:
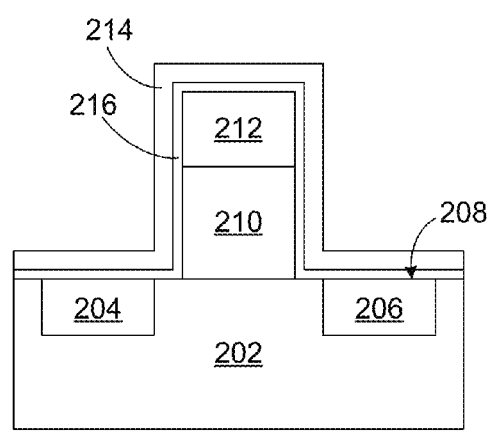
Figure 2C:
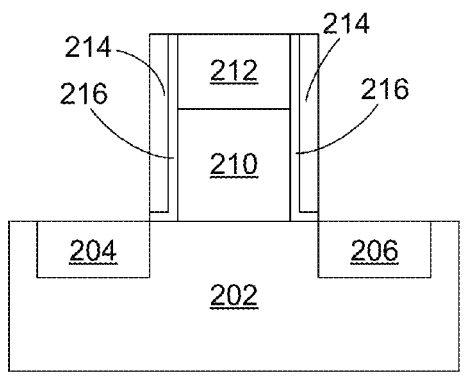
Figure 2D:
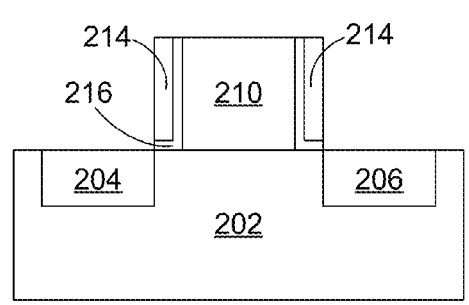

As shown in FIGS. 2A and 2B, FET 200 includes liner 216, which is in direct contact with at least the sidewalls of gate stack 210 and hardmask 212, and a portion of upper surface 208 of semiconductor body 202. In this exemplary embodiment, liner 216 serves as a diffusion barrier that prevents boron from diffusing into other regions of FET 200 during fabrication (e.g., during annealing to activate dopants after implanting them into source region 204 and drain region 206), where it might otherwise degrade device performance. In this exemplary embodiment, semiconductor body 202 comprises silicon germanium and/or germanium, and liner 216 comprises a conformal silicon nitride ($Si_3N_4$) layer. In another embodiment, liner 216 comprises a conformal silicon dioxide layer. Liner 216 may be deposited using any suitable technique known in the art, such as rapid thermal chemical vapor deposition (RTCVD), low pressure chemical vapor deposition (LPCVD), or plasma enhanced chemical vapor deposition (PECVD). Boron nitride is then deposited atop liner 216 (see FIG. 2B), and RIE is performed (see FIG. 2C) to form a boron nitride spacer 214 in direct contact with gate stack 210 and hardmask 212, after which hardmask 212 may be optionally removed (see FIG. 2D).

FIGS. 3A through 3H depict phases of fabrication of Fin-FET 300, in accordance with an embodiment of the present invention. FIGS. 3B, 3D, 3F, and 3H are alternative views of FinFET 300 shown in FIGS. 3A, 3C, 3E, and 3G, respectively, along the length of fin 318. In this embodiment, Fin-FET 300 is similar to FET 100 and FET 200, where like elements have reference numerals increased by a factor of 100. Unlike FET 100 and FET 200, however, FinFET 300 has fin 318.

In this exemplary embodiment, semiconductor body 302 comprises a III-V compound (e.g., indium phosphide), and fin 318 comprises another III-V compound (e.g., indium gallium arsenide). Fin 318 passes through gate stack 310 and encloses the channel through which charge carriers may pass from source region 304 to drain region 306. That is, gate stack 310 surrounds the sidewalls and an upper surface of fin 318.

Figure 3E:
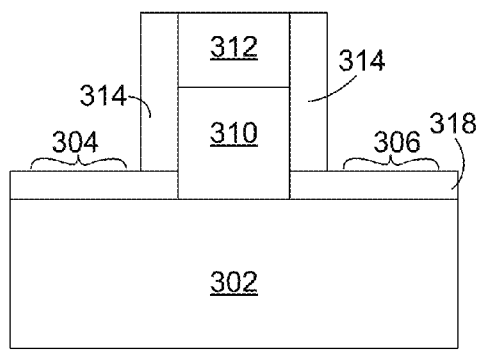
Figure 3F:
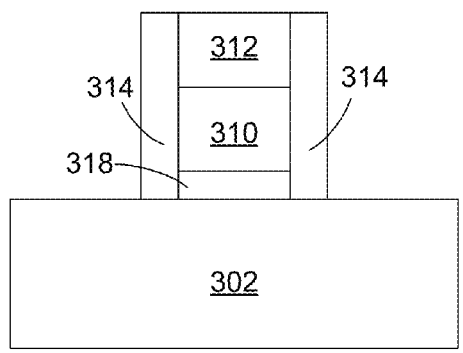
Figure 3G:
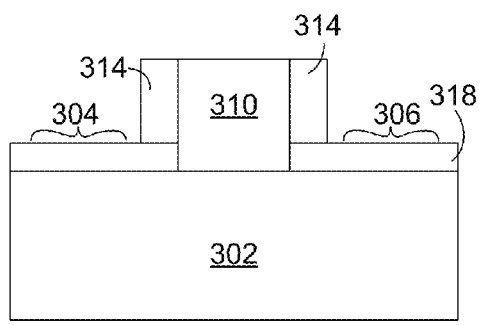
Figure 3H:
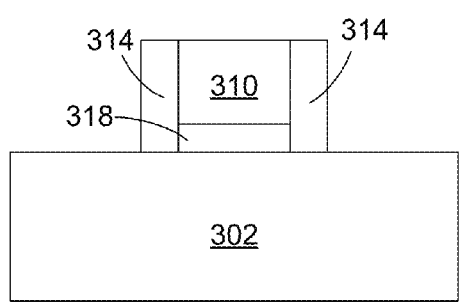
Figure 4A:
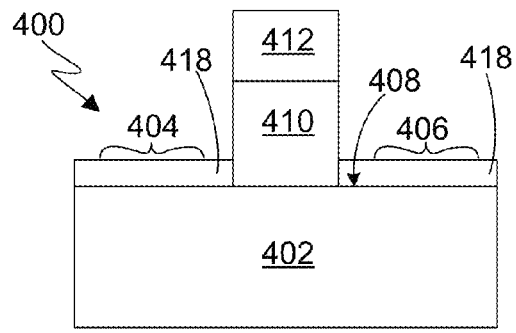
FIGS. 4A through 4H depict phases of fabrication of a transistor, in accordance with another embodiment of the present invention.
Figure 4B:
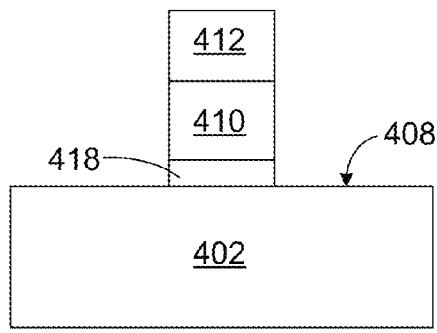
Figure 4C:
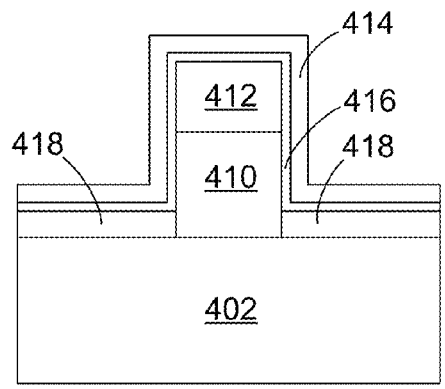
Figure 4D:
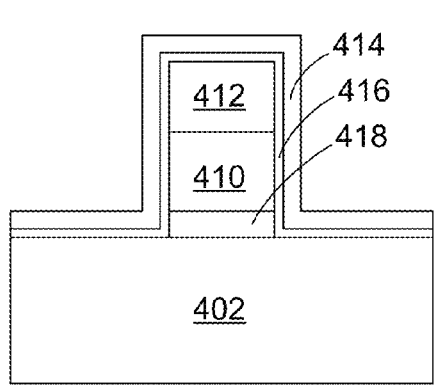
Figure 4E:
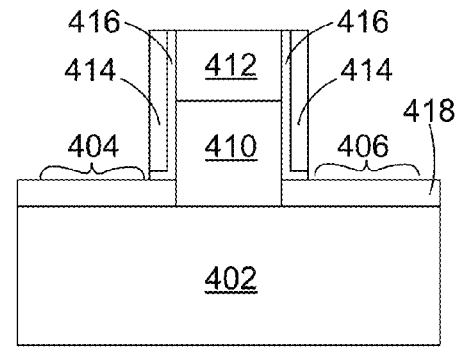
Figure 4F:
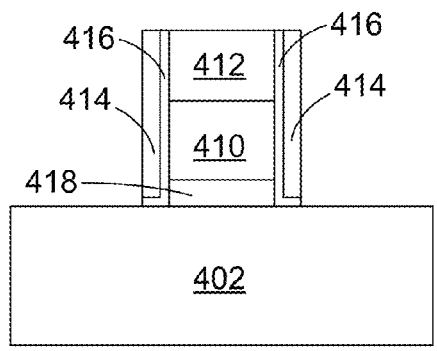
Figure 4G:
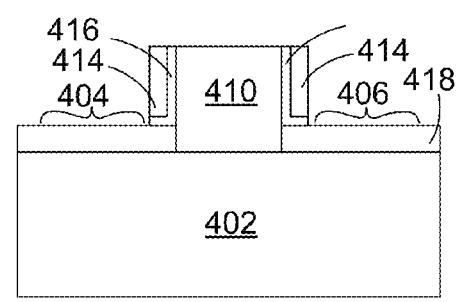
Figure 4H:
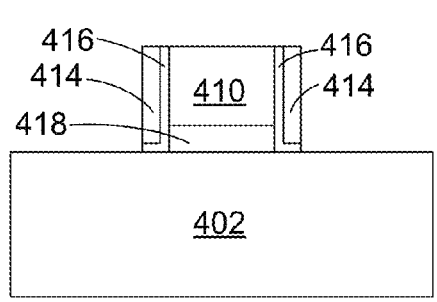

As previously discussed with regard to FET 100, FinFET 300 is fabricated by depositing boron nitride onto FinFET 300 (see FIGS. 3C and 3D) and using RIE to form boron nitride spacer 314 in direct contact with at least the sidewalls of gate stack 310, hardmask 312, and fin 318, as well as portions of upper surface 308 of semiconductor body 302 and an upper surface of fin 318 (see FIGS. 3E and 3F). Hardmask 312 may then be optionally removed (see FIGS. 3G and 3H).

FIGS. 4A through 4H depict phases of fabrication of Fin-FET 400, in accordance with an embodiment of the present invention. FIGS. 4B, 4D, 4F, and 4H are alternative views of FinFET 400 shown in FIGS. 4A, 4C, 4E, and 4G, respectively, along the length of fin 418. In this embodiment, Fin-FET 400 is similar to FET 100, FET 200, and FinFET 300, where like elements have reference numerals increased by a factor of 100. In this exemplary embodiment, semiconductor body 402 comprises silicon germanium and/or germanium.

As previously discussed with regard to FET 200, FinFET 400 is fabricated by depositing liner 416 (e.g., silicon nitride), such that liner 416 is in direct contact with at least the sidewalls of gate stack 410, hardmask 412, and fin 418, as well as portions of upper surface 408 of semiconductor body 402 and an upper surface of fin 418. Boron nitride spacer 414 is then formed by depositing boron nitride atop liner 416 (see FIGS. 4C and 4D) and performing RIE (see FIGS. 4E and 4F), after which hardmask 412 may be optionally removed (see FIGS. 4G and 4H).

Figure 5:
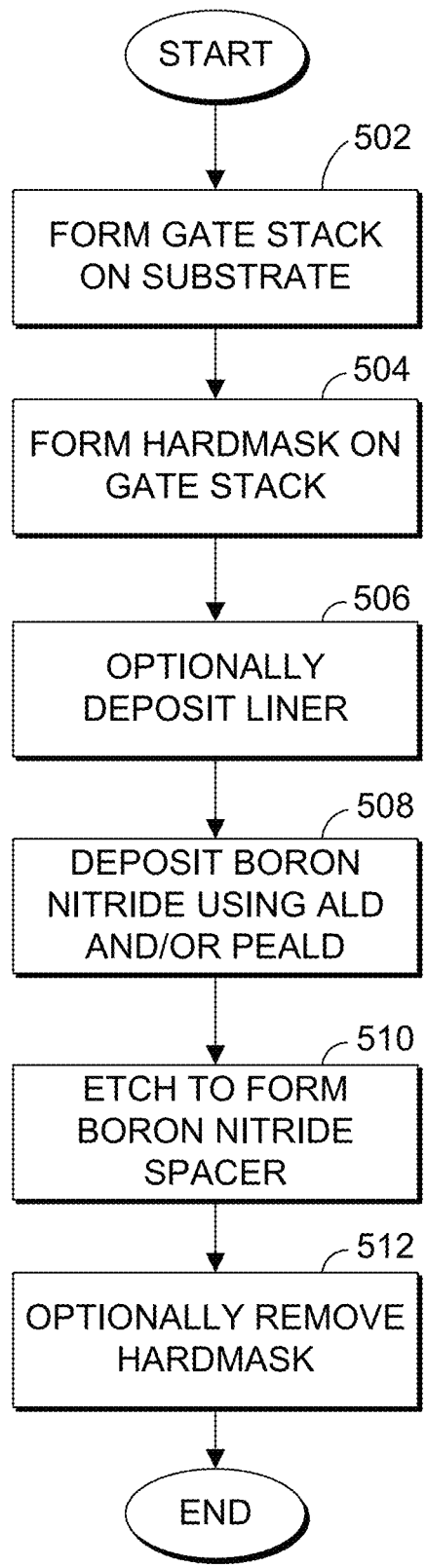
FIG. 5 is a flowchart depicting steps for fabricating a transistor having a boron nitride spacer, in accordance with an embodiment of the present invention.

FIG. 5 is a flowchart depicting steps for fabricating a transistor having a boron nitride spacer, in accordance with an embodiment of the present invention. Although the present disclosure provides details concerning forming boron nitride spacers on gate stacks of planar FETs and FinFETs, the process and structures disclosed herein may be used to fabricate boron nitride spacers and other boron nitride structures for a variety of devices and components thereof, including, but not limited to, other types of transistors.

In step 502, a gate stack (e.g., gate stack 110, 210, 310, or 410) is formed on a semiconductor body (e.g., semiconductor body 102, 202, 302, or 402). As previously discussed, the semiconductor body is preferably comprised of materials such as silicon germanium, germanium, and/or III-V compounds. In one embodiment, such as for higher thermal budget fabrication processes, the semiconductor body comprises a layer of silicon, atop a layer of silicon-on-insulator (SOI) having a buried oxide (BOX) layer, atop a silicon substrate. In another embodiment, such as for lower thermal budget fabrication processes, the semiconductor body comprises a layer of indium gallium arsenide (InGaAs), atop a layer of indium aluminum arsenide (InAlAs), atop indium phosphide (InP) substrate. The gate stack comprises a gate conductor layer (e.g., a metal or doped polysilicon) atop a gate dielectric layer (e.g., silicon dioxide), and may be formed using any known epitaxial growth and/or deposition techniques known in the art. In the context of a planar FET, the gate stack is disposed on an upper surface of the semiconductor body, with the channel located below the gate stack. In the context of a FinFET, the gate stack is disposed on an upper surface of the semiconductor body, but surrounds the sidewalls and upper surface of the fin and channel therein (i.e., the fin passes through the gate stack).

In step 504, a hardmask layer (e.g., hardmask 112, 212, 312, or 412) is deposited on the gate stack. The hardmask layer may be deposited using any suitable techniques known in the art, such as CVD.

In step 506, a liner layer (e.g., liner layer 216 or 416) is optionally deposited onto the gate stack, hardmask, and semiconductor body. In this exemplary embodiment, the liner layer is deposited in instances where boron may diffuse into other regions of the transistor during fabrication, such that the liner layer is in direct contact with at least the sidewalls of the gate stack and hardmask, as well as a portion of the upper surface of the semiconductor body. In the context of a Fin-FET, the liner layer is also in direct contact with the sidewalls of the fin and an upper surface of the fin. The liner layer may comprise, for example, a conformal silicon nitride layer, or a conformal silicon dioxide layer. The liner layer may be deposited using any suitable technique known in the art, such as RTCVD, LPCVD, or PECVD. Preferably, the liner layer has a thickness between 1 and 5 nm. In other embodiments, the liner layer may be omitted, such as where fabrication temperatures will not cause boron to diffuse into other regions of the transistor.

In step 508, a boron nitride layer is deposited onto the gate stack, hardmask, and semiconductor body, or, if present, the liner layer, using ALD and/or PEALD techniques. In this exemplary embodiment, the device is placed in a reaction chamber and is preferably heated to a temperature between 100 degrees Celsius and 500 degrees Celsius at a chamber pressure between 0.5 Torr and 10 Torr. More preferably, the temperature is between 300 degrees Celsius and 400 degrees Celsius, and the chamber pressure is between 0.5 Torr and 3 Torr.

A boron precursor gas, such as one or more of boron trichloride ($BCl_3$), trimethylboron ($B(CH_3)_3$), diborane ($B_2H_6$), boron tribromide ($BBr_3$), or a precursor gas diluted with an inert gas such as helium (He) or argon (Ar), is then pulsed into the chamber where it is allowed to form a monolayer, or less than a monolayer, on the exposed surfaces of the device (i.e., surfaces of the gate stack, hardmask, semiconductor body, and, if present, the liner layer). Preferably, the boron precursor is pulsed for a time period between 2 seconds to 30 seconds at a flow rate ranging from 50 standard cubic centimeters (sccm) per minute to 1,000 sccm per minute. More preferably, the flow rate at which the boron precursor is pulsed into the chamber is between 100 sccm per minute and 500 sccm per minute.

After the boron precursor is pulsed into the chamber, the chamber is purged with an inert gas, such as nitrogen ($N_2$), argon (Ar), or helium (He), for an amount of time (e.g., 30 seconds) necessary to remove byproducts and all unreacted species from the chamber.

A nitrogen-containing reactant gas, such as nitrogen, ammonia ($NH_3$), or a mixture of nitrogen and hydrogen ($H_2$), is then pulsed into the deposition chamber to react with the first layer and form a monolayer of boron-nitrogen. Preferably, the nitrogen-containing gas is pulsed into the chamber for a time period between 1 second and 10 seconds at a flow rate between 50 sccm per minute and 1,000 sccm per minute. More preferably, the flow rate at which the nitrogen-containing gas is pulsed is between 100 sccm per minute and 300 sccm per minute.

PEALD techniques may also be used when providing the nitrogen-containing reactant gas to the chamber, whereby the boron-nitrogen bond forming reactions are assisted by dissociating the reactant gases using a plasma. Preferably, where PEALD is used, the plasma condition is created at a power between 50 W to 500 W and, more preferably, at a power between 100 W and 200 W.

After pulsing the nitrogen-containing reactant gas, the chamber is again purged for an appropriate amount of time, and the cycle is repeated until deposition of the boron nitride layer has occurred to the desired thickness.

In step 510, portions of the boron nitride layer and, if present, the liner layer are removed by RIE to form a boron nitride spacer (e.g., boron nitride spacer 114, 214, 314, or 414), which is either in direct contact with the sidewalls of the gate stack and hardmask, or in contact with the liner layer.

In step 512, the hardmask is optionally removed by etching (e.g., using RIE), yielding a FET or FinFET having a boron nitride spacer in direct contact with the sidewalls of the gate stack or with the liner layer.

Preferably, the resulting boron nitride spacer has a hexagonal bonding configuration and is conformal with a thickness ranging from 1 nm to 20 nm and, more preferably, a thickness ranging from 1 nm to 10 nm. The term "conformal", as used herein, refers to a thickness that does not deviate by more than 50% to 100% of an average value for the thickness of the layer. Preferably, the boron nitride spacer has a hexagonal textured structure, and might include an initial amorphous region which is less than 5 nm thick. More preferably, the boron nitride spacer is formed with a hexagonal textured structure having no amorphous region.

Preferably, the boron nitride spacer comprises stoichiometric boron nitride (i.e., equal, or nearly equal, boron and nitrogen content) having an oxygen content between zero and five atomic percent. More preferably, the oxygen content of the boron nitride spacer is less than one atomic percent. Preferably, the boron nitride spacer, both as deposited in step 508 and post-RIE in step 510, possesses a wet etch rate that is less than wet etch rates (using the same etchant(s)) for thermal oxide and silicon nitride deposited via RTCVD. Preferably, the boron nitride, after performing RIE to form the spacer, possesses a dielectric constant (k) between 3 and 4.5.

The resulting FETs and FinFETs can be distributed in any form, can be active devices of ultra large scale integrated (ULSI, VLSI) semiconductor devices, or can be integrated with discrete circuit elements and/or other signal processing devices as part of an intermediate product, such as a motherboard, or an end product.

Figure 6:
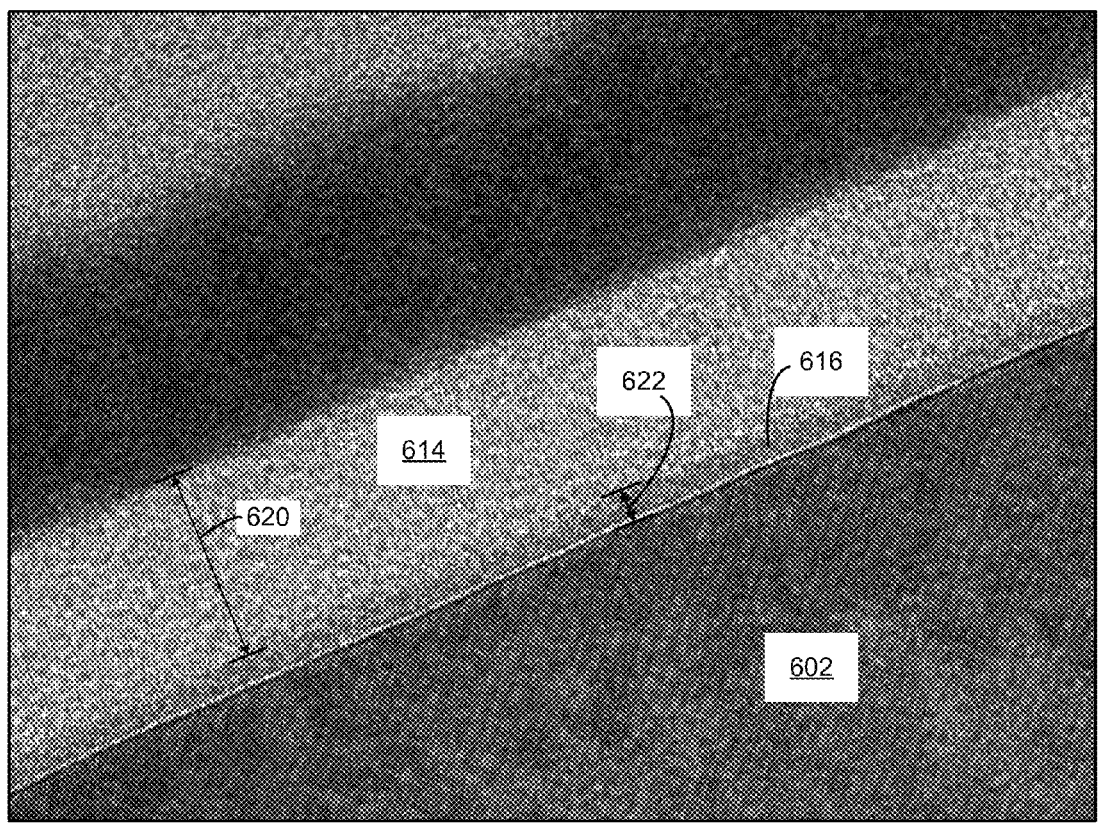
FIG. 6 is a transmission electron micrograph (TEM) showing a partial view of a transistor, fabricated in accordance with an embodiment of the present invention.

FIG. 6 is a transmission electron micrograph (TEM) showing a partial view of a transistor fabricated in accordance with an embodiment of the present invention. The transistor of FIG. 6 includes substrate 602 comprised of silicon. Liner 616 is disposed atop substrate 602, having thickness 622. In this example transistor, liner 616 comprises silicon nitride, and thickness 622 is approximately 2.2 nm. Boron nitride spacer 614 is disposed atop liner 616, having thickness 620. In this example transistor, boron nitride spacer 614 has a hexagonal textured structure, and thickness 620 is approximately 16.2 nm.

Figure 7:
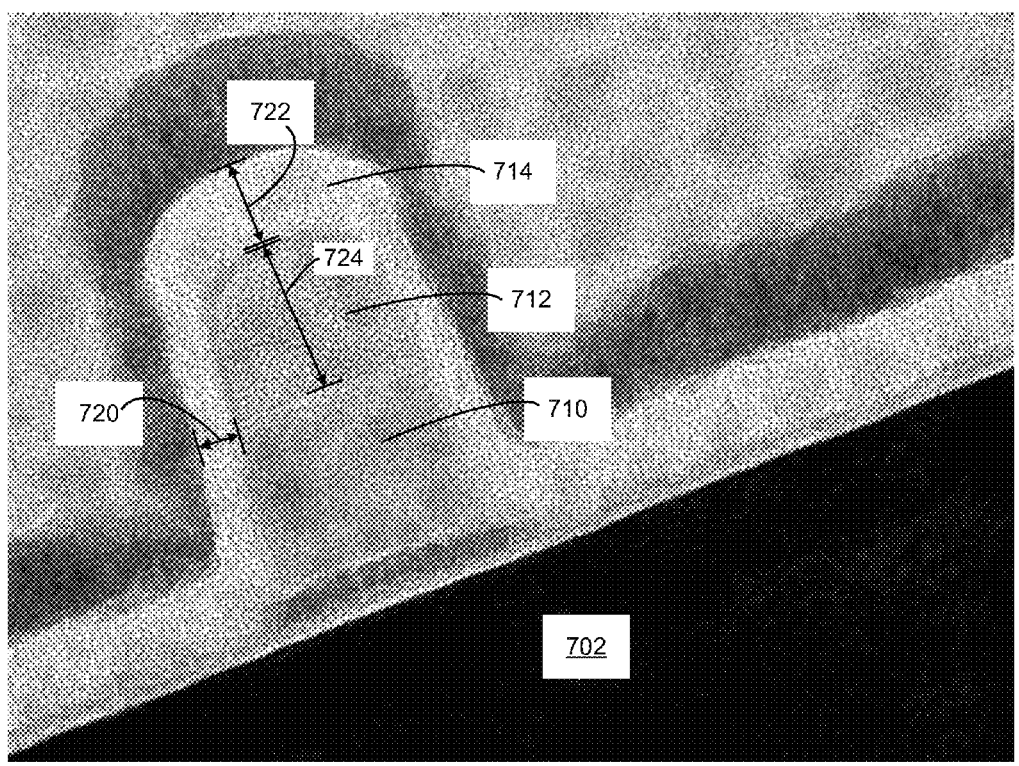
FIG. 7 is a transmission electron micrograph showing a partial view of a transistor, fabricated in accordance with another embodiment of the present invention.

FIG. 7 is a transmission electron micrograph (TEM) showing a partial view of a transistor fabricated in accordance with another embodiment of the present invention. The transistor of FIG. 7 includes substrate 702 comprised of silicon. Boron nitride spacer 714 is in direct contact with substrate 702, gate stack 710, and hardmask 712. In this example transistor, boron nitride spacer 714 has a hexagonal textured structure with a thickness 720 of approximately 8 nm and a thickness 722 of approximately 14.5 nm. In this example transistor, hardmask 712 has a thickness 724 of approximately 28 nm.

Figure 8:
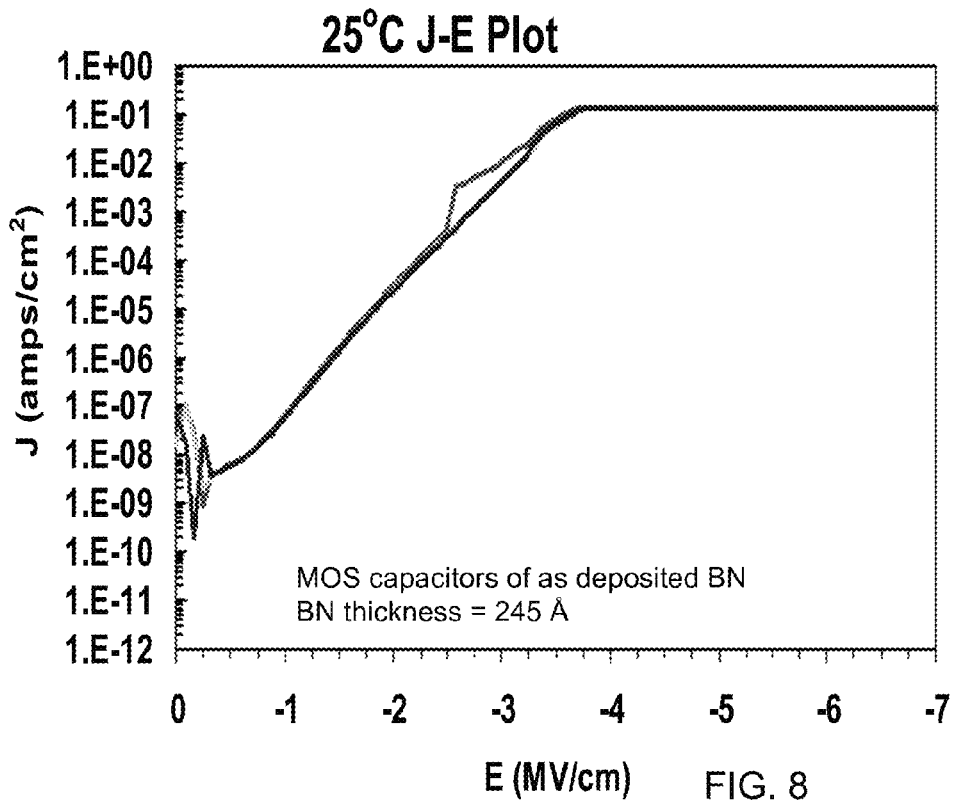
FIG. 8 is a graph illustrating leakage current density versus applied electrical field for boron nitride, deposited in accordance with an embodiment of the present invention.

FIG. 8 is a graph illustrating leakage current density versus applied electrical field for MOS capacitors of boron nitride deposited in accordance with an embodiment of the present invention, where the deposited boron nitride layer has a thickness of 245 angstroms (Å) (24.5 nm).

Figure 9:
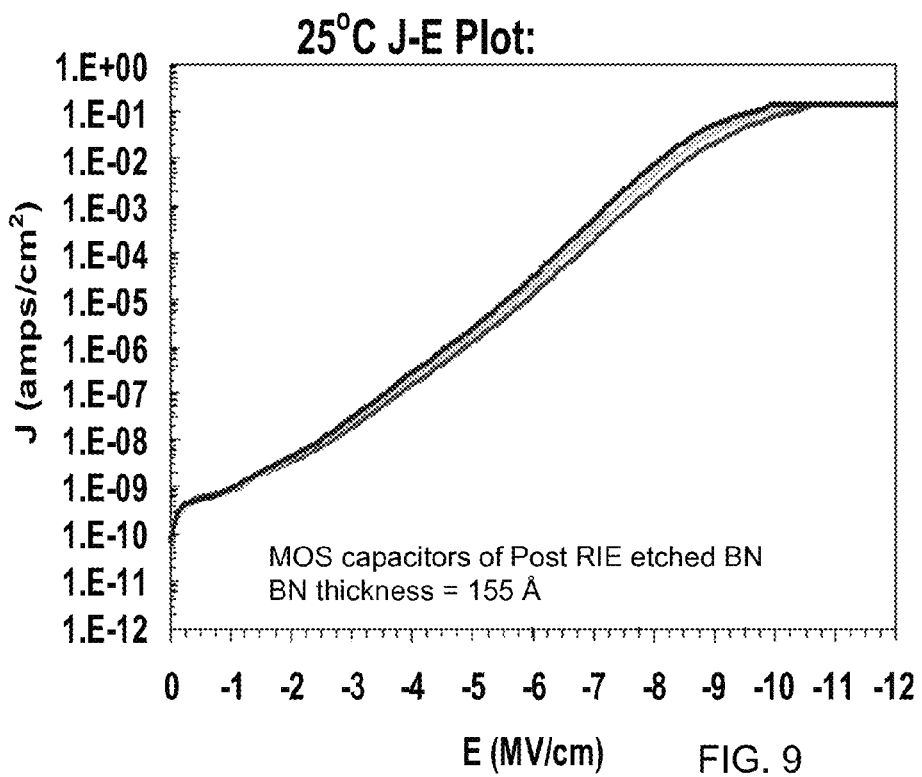
FIG. 9 is a graph illustrating leakage current density versus applied electrical field for the boron nitride layer of FIG. 8, after performing reactive ion etching, in accordance with an embodiment of the present invention.

FIG. 9 is a graph illustrating leakage current density versus applied electrical field for MOS capacitors of the boron nitride layer of FIG. 8, after performing RIE, where the boron nitride layer has a thickness of 155 Å (15.5 nm). After performing RIE to form the boron nitride spacer, the dielectric constant (K) of the boron nitride was reduced from approximately 6.6 to 3.36, and leakage current improved significantly, as shown in the graphs of FIGS. 8 and 9.

FIG. 10 is a table showing a comparison of wet etch rate ratios and dielectric constants for a silicon nitride layer and a hexagonal textured boron nitride layer, post-RIE, fabricated in accordance with an embodiment of the present invention. In this example, a 160 Å (16.0 nm) layer of silicon nitride was prepared using RTCVD, after which RIE was performed. A 160 Å (16.0 nm) layer of boron nitride was prepared in accordance with operational steps 508-510 of FIG. 5, using the same RIE conditions as used for the layer of silicon nitride.

The second and third rows of the table of FIG. 10 show wet etch rate ratios for the silicon nitride and boron nitride layers, as compared to thermal oxide. In the second row, etching was performed with diluted hydrofluoric acid (DHF) (diluted 100:1) at room temperature (RT). In the third row, etching was performed with ammonium hydroxide ($NH_4OH$), hydrogen peroxide ($H_2O_2$), and water ($H_2O$) at 35 degrees Celsius. As can be seen, the hexagonal textured boron nitride spacer possesses a wet etch rate that is less than thermal oxide and silicon nitride. In addition, the hexagonal textured boron nitride spacer has a lower dielectric constant of 3.36, as compared to 5.7 for the silicon nitride, as measured on MOS capacitors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described several embodiments of the present invention (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

What is claimed is:

1. A semiconductor device comprising:
   a semiconductor body;
   a gate stack disposed atop the semiconductor body; and
   a boron nitride spacer in direct contact with sidewalls of the gate stack and at least a portion of the semiconductor body, wherein the boron nitride spacer has a thickness greater than or equal to 1 nm and less than or equal to 20 nm and has a hexagonal bonding configuration.

2. The semiconductor device of claim 1, wherein the boron nitride spacer has a hexagonal textured structure, and the boron nitride spacer either includes an amorphous region which is less than or equal to 5 nm thick or includes no amorphous region.

3. The semiconductor device of claim 1, wherein the boron nitride spacer comprises stoichiometric boron nitride.

4. The semiconductor device of claim 1, wherein the boron nitride spacer comprises boron nitride that has an oxygen content less than or equal to five atomic percent, and boron nitride that, after performing reactive ion etching, has a dielectric constant greater than or equal to 3 and less than or equal to 4.5.

5. The semiconductor device of claim 1, wherein the semiconductor body comprises at least one of the following: silicon germanium (SiGe), germanium (Ge), and a III-V compound.

6. The semiconductor device of claim 1, wherein the semiconductor body comprises a silicon layer, atop a silicon-on-insulator (SOI) layer having a buried oxide (BOX) layer, atop a silicon substrate, or the semiconductor body comprises an indium gallium arsenide (InGaAs) layer, atop an indium aluminum arsenide (InAlAs) layer, atop an indium phosphide (InP) substrate.

7. The semiconductor device of claim 1, wherein boron nitride spacer has a wet etch rate that is less than a wet etch rate of silicon nitride ($Si_3N_4$) for one or more etchants.

8. The semiconductor device of claim 1, wherein the semiconductor device is a planar FET or a FinFET.

9. The semiconductor device of claim 1, wherein the boron nitride spacer comprises boron nitride deposited on the sidewalls of the gate stack and the at least a portion of the semiconductor body using one or both of atomic layer deposition (ALD) and plasma enhanced atomic layer deposition (PEALD).

10. A semiconductor device comprising:
    a semiconductor body;
    a gate stack disposed atop the semiconductor body;
    a liner layer in direct contact with sidewalls of the gate stack and at least a portion of the semiconductor body; and
    a boron nitride spacer in direct contact with at least a portion of the liner layer, wherein the boron nitride spacer has a thickness greater than or equal to 1 nm and less than or equal to 20 nm and has a hexagonal bonding configuration.

11. The semiconductor device of claim 10, wherein the boron nitride spacer has a hexagonal textured structure, and the boron nitride spacer either includes an amorphous region which is less than or equal to 5 nm thick or includes no amorphous region.

12. The semiconductor device of claim 10, wherein the boron nitride spacer comprises stoichiometric boron nitride.

13. The semiconductor device of claim 10, wherein the boron nitride spacer comprises boron nitride that has an oxygen content less than or equal to five atomic percent, and boron nitride that, after performing reactive ion etching, has a dielectric constant greater than or equal to 3 and less than or equal to 4.5.

14. The semiconductor device of claim 10, wherein the semiconductor body comprises at least one of the following: silicon germanium (SiGe), germanium (Ge), and a III-V compound.

15. The semiconductor device of claim 10, wherein the semiconductor body comprises a silicon layer, atop a silicon-on-insulator (SOI) layer having a buried oxide (BOX) layer, atop a silicon substrate, or the semiconductor body comprises an indium gallium arsenide (InGaAs) layer, atop an indium aluminum arsenide (InAlAs) layer, atop an indium phosphide (InP) substrate.

16. The semiconductor device of claim 10, wherein boron nitride spacer has a wet etch rate that is less than a wet etch rate of silicon nitride ($Si_3N_4$) for one or more etchants.

17. The semiconductor device of claim 10, wherein the semiconductor device is a planar FET or a FinFET.

18. The semiconductor device of claim 10, wherein the liner layer comprises at least one of the following: silicon nitride and a silicon oxide.

19. The semiconductor device of claim 10, wherein the boron nitride spacer comprises boron nitride deposited on the least a portion of the liner layer using one or both of atomic layer deposition (ALD) and plasma enhanced atomic layer deposition (PEALD).

* * * * *